(12) United States Patent
Ishiwata (10) Patent No.: US 9,257,465 B2
(45) Date of Patent: Feb. 9, 2016

(54) SOLID-STATE IMAGING DEVICE AND ELECTRONIC APPARATUS WITH INCREASED LENGTH OF AMPLIFYING PORTION

(71) Applicant: SONY CORPORATION, Tokyo (JP)

(72) Inventor: Hiroaki Ishiwata, Tokyo (JP)

(73) Assignee: SONY CORPORATION, Tokyo (JP)

( * ) Notice: Subject to any disclaimer, the term of this patent is extended or adjusted under 35 U.S.C. 154(b) by 280 days.

(21) Appl. No.: 13/679,492

(22) Filed: Nov. 16, 2012

(65) Prior Publication Data
US 2013/0146748 A1 Jun. 13, 2013

(30) Foreign Application Priority Data
Dec. 7, 2011 (JP) ................................. 2011-267505

(51) Int. Cl.
*H01L 27/146* (2006.01)

(52) U.S. Cl.
CPC .... *H01L 27/14609* (2013.01); *H01L 27/14603* (2013.01); *H01L 27/14641* (2013.01)

(58) Field of Classification Search
CPC ........................................... H04N 5/335–5/378
USPC ................................ 250/208.1; 348/294–324
See application file for complete search history.

(56) References Cited

U.S. PATENT DOCUMENTS

2011/0310282 A1* 12/2011 Toda et al. .................... 348/308

FOREIGN PATENT DOCUMENTS

| JP | 2009-026984 | 2/2009 |
|----|-------------|--------|
| JP | 2010-07-29  | 7/2010 |

* cited by examiner

*Primary Examiner* — Renee D Chavez
(74) *Attorney, Agent, or Firm* — Hazuki International, LLC (57) ABSTRACT

A solid-state imaging device includes pixels each of which has a photoelectric conversion portion that senses light and converts the sensed light into a charge; and an amplifying portion which is shared by a predetermined number of the pixels, amplifies the generated charge in the photoelectric conversion portion, and outputs a level of signal corresponding to the charge, wherein the a predetermined number of the pixels which share the amplifying portion are arranged in a first direction extending along a signal line via which the amplifying portion outputs the signal, and wherein a length of an area where the amplifying portion is formed along a second direction substantially intersecting the first direction is set to be equal to or more than a length of one pixel and to be less than a length of two pixels in the second direction.

12 Claims, 7 Drawing Sheets

SOLID-STATE IMAGING DEVICE AND ELECTRONIC APPARATUS WITH INCREASED LENGTH OF AMPLIFYING PORTION

BACKGROUND

The present disclosure relates to a solid-state imaging device and an electronic apparatus, in particular, to a solid-state imaging device and an electronic apparatus to achieve low noise and a high frame rate.

In recent years, CMOS (Complementary Metal Oxide Semiconductor) image sensors have been increasingly employed as an imaging device for mobile phones with an imaging function, digital still cameras, camcorders, and surveillance cameras and the like. The CMOS image sensor has a characteristic that a pixel portion and a peripheral circuit portion are formed on the same semiconductor substrate.

In the pixel portion, a number of pixels are formed in an array. Generally, a four-transistor-type pixel architecture is often employed in a pixel, which includes a transfer transistor, an amplifying transistor, a selection transistor and a reset transistor.

The transfer transistor transfers a charge accumulated in a PD (Photodiode) that is a photoelectric conversion portion and a charge accumulation portion, to an FD (Floating Diffusion) detecting the charge generated in the PD. The amplifying transistor amplifies the charge accumulated in the FD and outputs a level of signal corresponding to the charge. The selection transistor selects a pixel which is a target for signal reading, and the reset transistor resets the charge accumulated in the FD.

In addition, in order to reduce the pixel size, a three-transistor-type pixel architecture may often be employed, which includes a transfer transistor, an amplifying transistor and a reset transistor, without a selection transistor being mounted.

However, recently, corresponding to a demand for an imaging device with more pixels, smaller size and the like, the size of the pixel mounted on an imaging device has been reduced. For example, a pixel sharing structure can be employed to reduce the size of the CMOS image sensor.

In a predetermined number of the pixels (for example, two or four pixels) as a share unit, the pixel sharing structure is a pixel architecture using the FD, the amplifying transistor, the selection transistor and the reset transistor in common, and having the PD and the transfer transistor respectively. For example, a two-pixel sharing structure is formed with two pixels by using the FD, the amplifying transistor, the selection transistor and the reset transistor in common, wherein the two pixels have the PD and the transfer transistor respectively.

Accordingly, while eight transistors are used in two pixels (four transistors per pixel) in a case where the pixel sharing structure is not employed, five transistors are used in two pixels in a case where the two-pixel sharing structure is employed. In other words, the two-pixel sharing structure may have only 2.5 transistors per pixel, it is possible to reduce the area where a transistor occupies, and to increase the area of the PD.

For example, Japanese Unexamined Patent Application Publication No. 2009-26984 discloses a solid-state imaging device in which sensitivity deviation between pixels is reduced, while maintaining a high aperture ratio, by employing the pixel sharing structure.

However, in the solid-state imaging device disclosed in Japanese Unexamined Patent Application Publication No. 2009-26984, in order to suppress the sensitivity deviation between green pixels in a row in which red pixels are arranged and green pixels in a row in which blue pixels are arranged, the amplifying transistor, the selection transistor and the reset transistor are preferably included within a pixel pitch. Therefore, the gate length of the amplifying transistor is restricted by the pixel pitch. As the pixel size is reduced and the gate length of the amplifying transistor is set to be shortened, random noise of the amplifying transistor is increased and thus it is difficult to realize low noise. In this way, it is assumed that imaging properties deteriorate.

Here, an S/N ratio (signal/noise ratio) of a signal to noise is known as one of the characteristics determining image quality of the CMOS image sensor. The signal is obtained from the product of the sensitivity of the imaging device and conversion efficiency, and the noise includes a random noise or a shot noise and the like. The random noise is known as one caused by the pixels and one caused by peripheral transistors. The random noise caused by the pixels includes noise generated in the PD and noise generated in the amplifying transistor. Recently, as an embedded photodiode structure has been employed as the CMOS image sensor, the noise generated in the PD is remarkably reduced. On the other hand, the noise generated in the amplifying transistor tends to largely affect the random noise.

In addition, it is known that a 1/f noise which is a type of the random noise generated in the amplifying transistor is in inverse proportion to the product of the gate length and the gate width of the amplifying transistor. That is, in order to improve the S/N characteristic, it is effective to increase the size (gate length L×gate width W) of the amplifying transistor.

Japanese Unexamined Patent Application Publication No. 2010-165854 discloses the solid-state imaging device, which is formed by a structure having a layout using a photodiode array of two pixels in a vertical direction and 4×n pixels in a horizontal direction as one shared unit, and in which the size of the amplifying transistor is increased.

However, in the solid-state imaging device in Japanese Unexamined Patent Application Publication No. 2010-165854, it is assumed that, even though it is effective to reduce the 1/f noise by increasing the size of the amplifying transistor, it is difficult to cope with speeding-up of a frame rate. That is, in the pixel sharing structure which shares the pixels arranged in a horizontal direction intersecting a direction of signal lines which read out the signals from the pixels, since it is difficult to perform a signal process at the following stage until the reading of the signals is completed from the plurality of columns sharing the pixels, pixel signal reading speed is restricted. Therefore, it is difficult to realize a high frame rate in the pixel sharing structure sharing the pixels in the horizontal direction.

SUMMARY

As described above, in the solid-state imaging device, in the related art, disclosed in Japanese Unexamined Patent Application Publication No. 2009-26984 and Japanese Unexamined Patent Application Publication No. 2010-165854, it is difficult to achieve both low noise and a high frame rate.

It is desirable to achieve both low noise and a high frame rate.

According to an embodiment of the present disclosure, there is provided a solid-state imaging device including: pixels each of which has a photoelectric conversion portion that senses light and converts the sensed light into a charge; and an amplifying portion which is shared by a predetermined number of the pixels, amplifies the generated charge in the photoelectric conversion portion, and outputs a level of signal corresponding to the charge, wherein a predetermined number of the pixels which share the amplifying portion are arranged in a first direction extending along a signal line via which the amplifying portion outputs the signal, and wherein a length of an area where the amplifying portion is formed along a second direction substantially intersecting the first direction is set to be equal to or more than a length of one pixel and to be less than a length of two pixels in the second direction.

According to another embodiment of the present disclosure, there is provided an electronic apparatus including a solid-state imaging device which includes: pixels each of which has a photoelectric conversion portion that senses light and converts the sensed light into a charge; and an amplifying portion which is shared by a predetermined number of the pixels, amplifies the generated charge in the photoelectric conversion portion, and outputs a level of signal corresponding to the charge, wherein the a predetermined number of the pixels which share the amplifying portion are arranged in a first direction extending along a signal line via which the amplifying portion outputs the signal, and wherein a length of an area where the amplifying portion is formed along a second direction substantially intersecting the first direction is set to be equal to or more than a length of one pixel and to be less than a length of two pixels length in the second direction.

According to the embodiments of the present disclosure, the pixels are arranged along the first direction extending along the signal line in which the amplifying portion outputs a signal, and the length of the area where the amplifying portion is formed along the second direction substantially intersecting the first direction is set to be equal to or more than a length of one pixel and to be less than a length of two pixels in the second direction.

According to the embodiments of the present disclosure, it is possible to achieve both low noise and a high frame rate.

DETAILED DESCRIPTION OF EMBODIMENTS

Hereinafter, an specific embodiment of the present disclosure is described with reference to the drawings.

Figure 1:
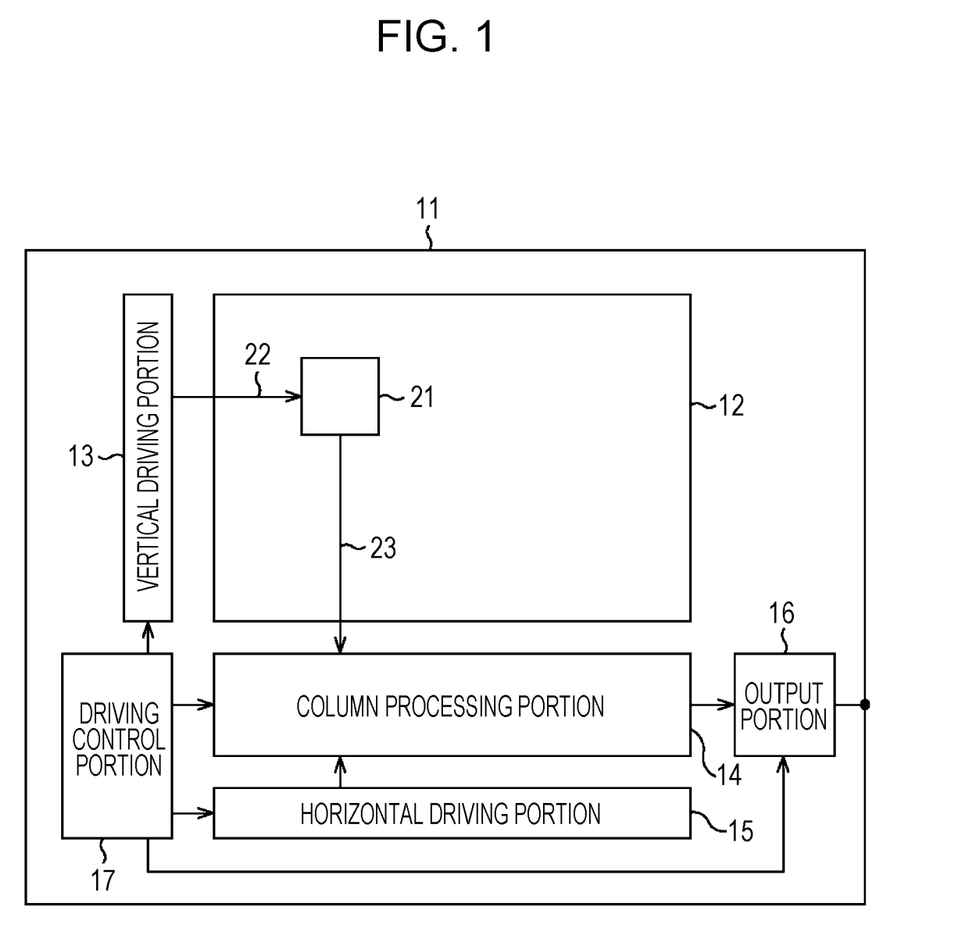
FIG. 1 is a block diagram illustrating a configuration example of an imaging device according to an embodiment of the present disclosure.

FIG. 1 is a block diagram illustrating a configuration example of an imaging device according to an embodiment of the present disclosure.

A solid-state imaging device 11 is a CMOS solid-state imaging device, which is configured by a pixel-array portion 12, a vertical driving portion 13, a column processing portion 14, a horizontal driving portion 15, an output portion 16, a driving control portion 17.

The pixel-array portion 12 has a plurality of pixels 21 arranged in an array, is connected to the vertical driving portion 13 via a plurality of horizontal signal lines 22 corresponding to the number of the rows of pixels 21 and is connected to the column processing portion 14 via the plurality of vertical signal lines 23 corresponding to the number of the columns of the pixels 21. That is, the plurality of pixels 21 included in the pixel-array portion 12 are respectively disposed at intersecting points where the horizontal signal lines 22 and the vertical signal lines 23 intersect to each other.

The vertical driving portion 13 sequentially supplies driving signals (transfer signal TG, selection signal SEL, reset signal RST and the like) for driving each of the pixels 21 via the horizontal signal lines 22 in every row of the plurality of pixels 21 included in the pixel-array portion 12.

The column processing portion 14 performs a CDS (Correlated Double Sampling) process with respect to a pixel signal output from each of the pixels 21 via the vertical signal lines 23, extracts the level of the pixel signal, and obtains pixel data corresponding to the amount of light sensed by the pixel 21.

The horizontal driving portion 15 sequentially supplies, to the column processing portion 14, a driving signal for sequentially outputting the pixel data which is obtained from each of the pixels 21 from the column processing portion 14 in every row of the plurality of pixels 21 included in the pixel-array portion 12.

The output portion 16 is supplied with the pixel data from the column processing portion 14 at a timing of the driving signal of the horizontal driving portion 15, for example, the output portion 16 amplifies the pixel data and outputs the pixel data to the image processing circuit at the following stage.

The driving control portion 17 controls the driving of each block inside the solid-state imaging device 11. For example, the driving control portion 17 generates a block signal according to the driving period of each block and supplies the block signal to the each block.

As the solid-state imaging device 11 is configured in this way, an image is obtained by performing the image process with respect to the pixel data obtained from the plurality of pixels 21 arranged in the pixel-array portion 12. In addition, as the pixel 21 is configured by a plurality of transistors for outputting the pixel signal, it is possible to employ a structure in which a predetermined number of pixels 21 share some of the transistors as a sharing unit.

Figure 2:
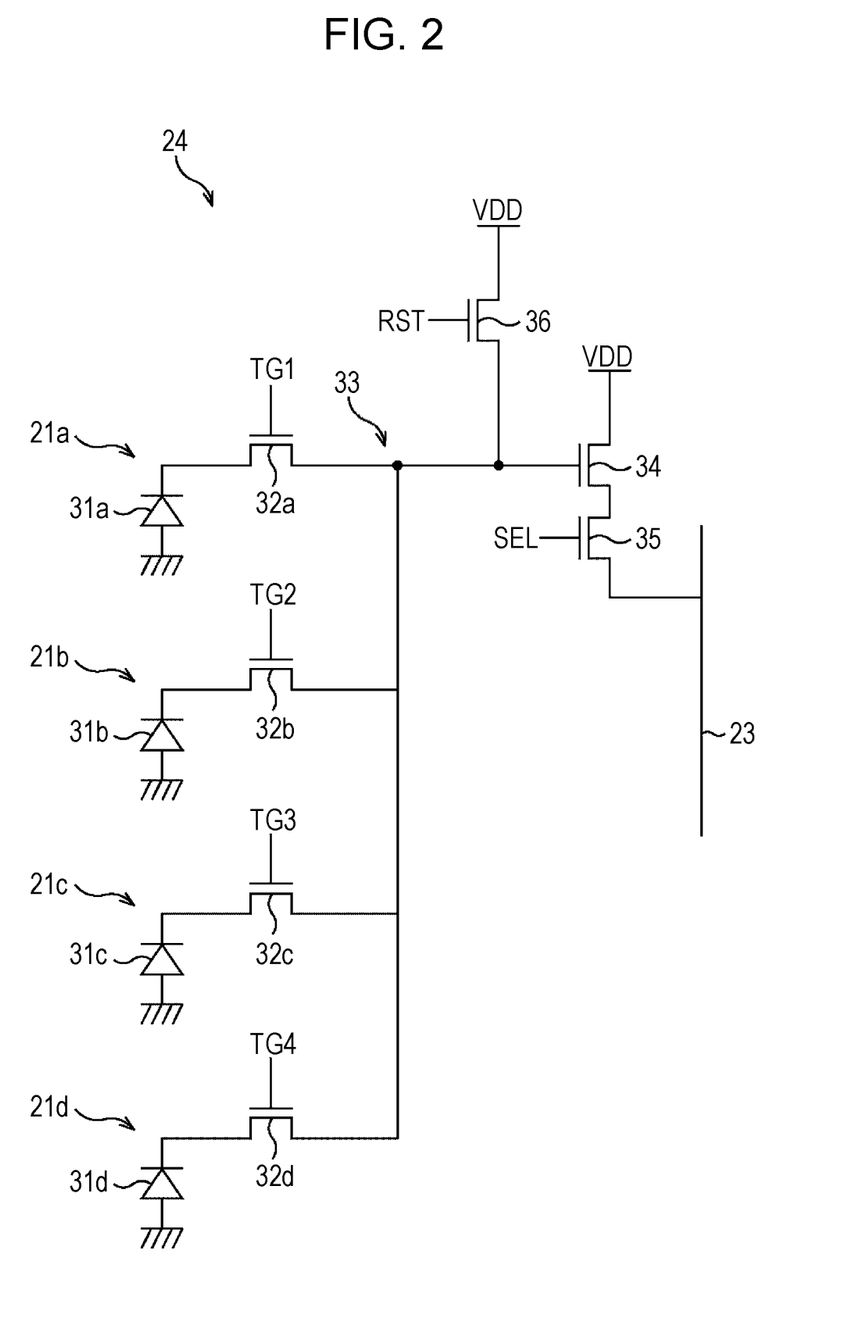
FIG. 2 is a circuit diagram illustrating a configuration example of one pixel sharing unit.

FIG. 2 is a circuit diagram illustrating a configuration example of a pixel sharing unit configured by four of the pixels 21.

As illustrated in FIG. 2, the pixel sharing unit 24 has a pixel 21a having a PD 31a and a transfer transistor 32a, a pixel 21b having a PD 31b and a transfer transistor 32b, a pixel 21c having a PD 31c and a transfer transistor 32c and a pixel 21d having a PD 31d and a transfer transistor 32d. And the pixels 21a to 21d are configured by a sharing structure which shares an FD 33, an amplifying transistor 34, a selection transistor 35 and a reset transistor 36.

The PDs 31a to 31d are a photoelectric conversion portion and a charge accumulation portion, and generate the charge corresponding to the amount of each of sensed light and accumulate the charge.

The transfer transistors 32a to 32d are respectively connected to the PDs 31a to 31d and the FD 33, and are driven according to transfer signals TG1 to TG4 supplied from the vertical driving portion 13 through the horizontal signal lines 22. For example when the transfer transistor 32a is turned on according to the transfer signal TG1, the charge which is accumulated in the PD 31a is transferred to the FD 33, and when the transfer transistor 32b is turned on according to the transfer signal TG2, the charge which is accumulated in the PD 31b is transferred to the FD 33. In addition, when the transfer transistor 32c is turned on according to the transfer signal TG3, the charge which is accumulated in the PD 31c is transferred to the FD 33, and when the transfer transistor 32d is turned on according to the transfer signal TG4, the charge which is accumulated in the PD 31d is transferred to the FD 33.

The FD 33 is a floating diffusion area which is formed at an intersecting point of the transfer transistors 32a to 32d and the amplifying transistor 34, and the charges generated in the PDs 31a to 31d are transferred to and accumulated in the FD. In addition, as described below with reference to FIG. 3, the FD 33 is configured that an FD 33a and an FD 33b are connected to each other. In detail, the PD 31a and the transfer transistor 32a are shared with PD 31b and transfer transistor 32b in the FD 33a, and the PD 31c and the transfer transistor 32c are shared with the PD 31d and the transfer transistor 32d in the FD 33b.

A gate electrode of the amplifying transistor 34 is connected to the FD 33, a drain terminal of the amplifying transistor 34 is connected to a voltage source potential VDD, and a source terminal of the amplifying transistor 34 is connected to the vertical signal line 23 through the selection transistor 35. And the amplifying transistor 34 amplifies the charge accumulated in the FD 33 and outputs, to the vertical signal line 23, the level of the pixel signal corresponding to the charge. For example, the amplifying transistor 34 outputs the reset level of the pixel signal, when the FD 33 is reset, and outputs the level of the pixel signal corresponding to the charge, when the charges generated in the PDs 31a to 31d are respectively accumulated in the FD 33.

The selection transistor 35 connects the amplifying transistor 34 and the vertical signal lines 23 and is driven according to the selection signal SEL supplied from the vertical driving portion 13 via the horizontal signal line 22. When the selection transistor 35 is turned on, it becomes a state where the pixel signal output from the amplifying transistor 34 can be output to the vertical signal lines 23 through the selection transistor 35.

The reset transistor 36 connects the FD 33 and the voltage source potential VDD and is driven according to the reset signal RST supplied from the vertical driving portion 13 through the horizontal signal line 22. When the reset transistor 36 is turned on, the charge accumulated in the FD 33 is discharged to the voltage source potential VDD, thereby resetting the FD 33.

The pixel sharing unit 24 configured as described above, for example, outputs each of the pixel signals to the vertical signal line 23 in order of the pixel 21a, the pixel 21b, the pixel 21c and the pixel 21d.

By the way, in the pixel sharing structure where the plurality of pixels 21 share the amplifying transistor 34 and the like, when the respective pixels 21 are arranged in a horizontal direction (a direction along the horizontal signal line 22 in FIG. 1), it is difficult to perform the signal process at the following stage until a plurality of the shared pixels in the horizontal direction are completely read out. Accordingly, when the pixels 21 are shared in the horizontal direction, reading speed of the pixel signal is limited. The signal process of the following stage includes a conversion process such as an analog to digital converter. When the signal process of the following stage takes long time, a frame rate that indicates how many screens can be formed in a second is difficult to increase.

In contrast, in the pixel sharing structure where the plurality of pixels 21 are arranged in a vertical direction (a direction along the vertical signal line 23 in FIG. 1), without waiting until the reading of other pixel signals is completed in a column. Therefore, in comparison with the pixel sharing structure which shares the pixels 21 arranged in the horizontal direction, the pixel signal can be read out fast and the frame rate can be increased.

Therefore, in order to be able to read the pixel signal fast, the solid-state imaging device 11 employs a layout in which pixels 21a to 21d which configure the pixel sharing unit 24 are vertically arranged in a line.

Next, a planar layout of the pixel sharing unit 24 will be described with reference to FIG. 3.

Figure 3:
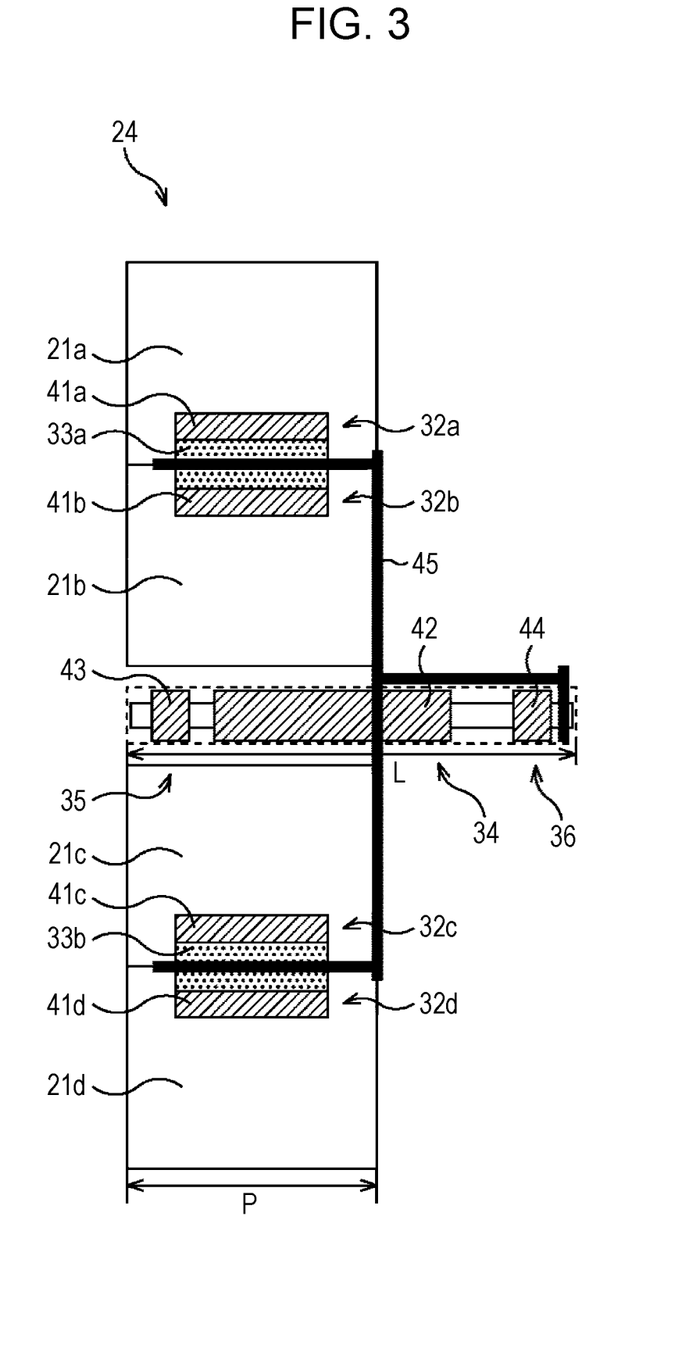
FIG. 3 is a diagram illustrating a planar layout of the pixel sharing unit.

As illustrated in FIG. 3, the pixel sharing unit 24 is formed by the layout in which the pixel 21a, the pixel 21b, the pixel 21c and the pixel 21d are vertically arranged in a line. The pixel 21a and the pixel 21b are adjacent to each other, the pixel 21c and the pixel 21d are adjacent to each other, and a predetermined gap between the pixel 21b and the pixel 21c is set.

The FD 33a is formed in a thin rectangular shape in a portion where a pixel 21a-1 and a pixel 21b-1 are abutted to each other. Further, a gate electrode 41a of the transfer transistor 32a is disposed in the pixel 21a side, which is adjacent to the FD 33a, and a gate electrode 41b of the transfer transistor 32b is disposed in the pixel 21b side, which is adjacent to the FD 33a. Similarly, a gate electrode 41c of the transfer transistor 32c is disposed in the pixel 21c side of the FD 33b which is formed in a portion where the pixel 21c and the pixel 21d are abutted to each other, and a gate electrode 41d of the transfer transistor 32d is disposed in the pixel 21d side of the FD 33b.

In the pixel sharing unit 24, a gate electrode 42 of the amplifying transistor 34, a gate electrode 43 of the selection transistor 35 and a gate electrode 44 of the reset transistor 36 are disposed between the pixel 21b and the pixel 21c.

The gate electrode 42 of the amplifying transistor 34, the gate electrode 43 of the selection transistor 35 and the gate electrode 44 of the reset transistor 36 are horizontally disposed in a line. That is, on the left side of the gate electrode 42 of the amplifying transistor 34 in the horizontal direction, the gate electrode 43 of the selection transistor 35 is disposed, and on the right side of the gate electrode 42 of the amplifying transistor 34 in the horizontal direction, the gate electrode 44 of the reset transistor 36 is disposed. In addition, the FDs 33a and 33b, the gate electrode 42 of the amplifying transistor 34, and a source terminal of the reset transistor 36 are connected to each other via a wire 45.

Likewise, in the pixel sharing unit 24, As the FDs 33a and 33b are connected to each other and the amplifying transistor 34 is disposed in the center of the pixel sharing unit 24, it is possible to minimize a length of the wire 45 which connects the FDs 33a and 33b. As the length of the wire 45 is shortened in this way, it is possible to suppress degradation of conversion efficiency when the charges accumulated in the FDs 33a and 33b are converted into the pixel signal.

In addition, in the pixel sharing unit 24, a horizontal length L of an area where the gate electrodes 42 to 44 are formed (an area shown in a dashed line in FIG. 3) is set to be longer than a pitch P which is a horizontal length of the pixels 21a to 21d. For example, in the configuration example of FIG. 3, as the area where the gate electrodes 42 to 44 are formed is set to be projected to the right direction from the pixels 21a to 21d, the pixel sharing unit 24 is formed to be a convex shape to the right direction. Meanwhile, the area where the gate electrodes 42 to 44 are formed may be projected to the left direction from the pixels 21a to 21d, and in this case, the pixel sharing unit 24 is formed to be a convex shape to the left direction.

In addition, the horizontal length L of the area in which the gate electrodes 42 to 44 are formed is set so as not to be projected to the right side of the pixels 21a to 21d (not shown) which are adjacent in right side, that is, the so as to be less than twice the pitch P which is horizontal length of the pixels 21a to 21d. That is, the horizontal length L of the area where the gate electrodes 42 to 44 are formed is set to be equal to or more than one-pixel pitch and to be less than a length of two-pixel pitch.

Moreover, in the pixel sharing unit 24, a gate length of the gate electrode 42 in the amplifying transistor 34 is set to be the maximum.

For example, as a gate length of the gate electrode 43 in the selection transistor 35 and a gate length of the gate electrode 44 in the reset transistor 36 are respectively adjusted to the minimum so as to suppress a deviation in devices, it is possible to set the gate length of the gate electrode 42 of the amplifying transistor 34 to be the maximum by allocating the remaining length L to a gate length of the gate electrode 42 of the amplifying transistor 34. Furthermore these gate lengths are set by the size regulated by design rules such as a pixel separation area, a distance between adjacent gate electrodes, a distance of a gate and a contact, and an overlap of the contact and the active portion.

For instance, as illustrated in FIG. 3, it is possible to set the gate length of the gate electrode 42 in the amplifying transistor 34 to be approximately the same length of the pitch P which is a horizontal length of the pixels 21a to 21d. And the gate length of the gate electrode 42 in the amplifying transistor 34 may be set to be pitch P or more which is the horizontal length of the pixels 21a to 21d.

In the pixel sharing unit 24 configured in this way, as the gate length of the gate electrode 42 in the amplifying transistor 34 is maximized as possible, the size of the amplifying transistor 34 can be increased. In this way, it is possible to reduce 1/f noises of the pixels 21a to 21d and to reduce random noise of the pixels 21a to 21d.

In addition, as described above, as the pixel sharing unit 24 employs the structure in which the pixels 21a to 21d are arranged in the vertical direction, the reading speed of the pixel signal can be increased.

Accordingly, in the solid-state imaging device 11 having the pixel-array portion 12 on which the pixel sharing units 24 are spread, it is possible to improve the image quality by reducing the noise and to realize a high frame rate. That is, the solid-state imaging device 11 can achieve both the low noise and the high frame rate.

Figure 4:
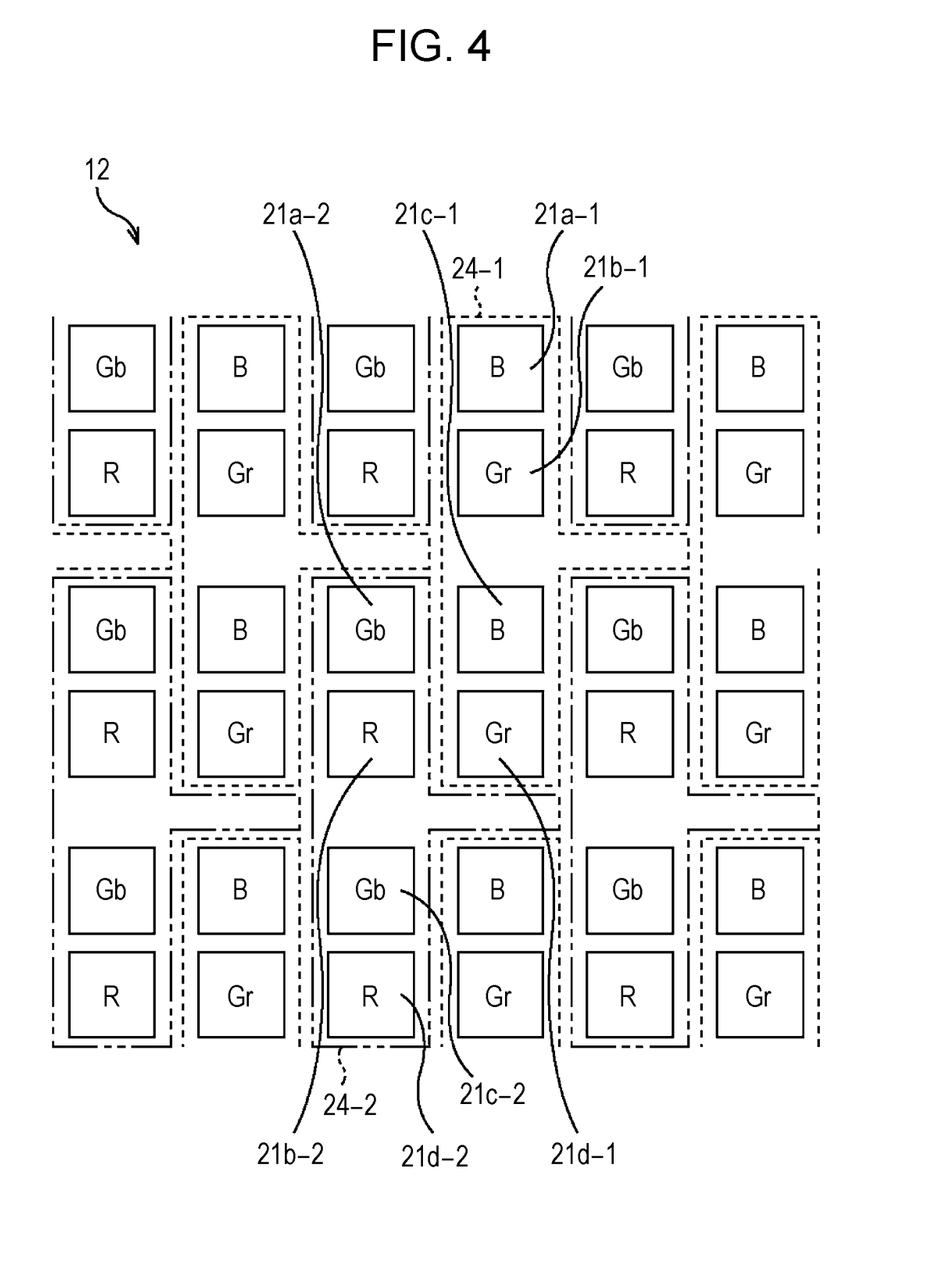
FIG. 4 is a diagram illustrating a portion of the pixel-array portion on which the pixel sharing units are spread.

FIG. 4 is a diagram illustrating a portion of the pixel-array portion 12 on which the pixel sharing units 24 are spread.

In FIG. 4, squares which are arranged in a matrix form indicate the pixels 21. In the pixel-array portion 12, color filters in which the three primary colors (blue, red and green) are arranged in a Bayer array, are arranged, and the pixels 21 sense the color of light corresponding to each color. In other words, FIG. 4 illustrates that the pixels 21 marked with the letter "R" sense red light, the pixels 21 marked with the letter "B" sense blue light and the pixels 21 marked with the letters "Gr" or "Gb" sense green light.

Furthermore, a column of the pixels 21 which senses blue and green colors of light and a column of the pixels 21 which senses red and green colors of light are alternatively arranged in every other column. As described with reference to FIG. 3, the pixel sharing unit 24 employs the layout in which pixels 21a to 21d are arranged in a column. So in the pixel-array portion 12, a pixel sharing unit 24-1 sensing blue light and green light, a pixel sharing unit 24-2 sensing red light and green light are alternatively arranged in every other column.

Therefore, in the pixel sharing unit 24-1, a pixel 21a-1 and a pixel 21c-1 sense blue light and a pixel 21b-1 and a pixel 21d-1 sense green light. On the other hand, the pixel sharing unit 24-2, a pixel 21a-2 and a pixel 21c-2 sense green light and a pixel 21b-2 and a pixel 21d-2 sense red light.

Furthermore, in pixel-array portion 12, the pixel sharing unit 24-1 and the pixel sharing unit 24-2 are arranged so as to be shifted relative to each other by two-pixel pitch in the vertical direction. For example, the pixel 21a-1 of the pixel sharing unit 24-1 and the pixel 21c-2 of the pixel sharing unit 24-2 are arranged in the horizontal direction and, the pixel 21b-1 of the pixel sharing unit 24-1 and the pixel 21d-2 of the pixel sharing unit 24-2 are arranged in the horizontal direction. Similarly, the pixel 21c-1 of the pixel sharing unit 24-1 and the pixel 21a-2 of the pixel sharing unit 24-2 are arranged in the horizontal direction and, the pixel 21d-1 of the pixel sharing unit 24-1 the pixel 21b-2 of the pixel sharing unit 24-2 are arranged in the horizontal direction.

Arranged as above, when the pixel sharing units 24 having a convex shape projected in the right direction are spread on the pixel-array portion 12, the projected portion thereof can be arranged not to be overlapped with the adjacent pixel sharing unit 24.

In other words, the portion projected to the right side in the area where the gate electrodes 42 to 44 of the pixel sharing unit 24-1 are formed, is disposed in an area between two adjacent pixel sharing units 24-2 in the vertical direction, which are adjacent to each other in right side of the pixel sharing unit 24-1. Similarly, the (right-) projected portion of the area where the gate electrodes 42 to 44 of the pixel sharing unit 24-2 are formed, is disposed in an area between two adjacent pixel sharing units 24-1 in the vertical direction, which are adjacent to each other in the right side of the pixel sharing unit 24-2.

In addition, in the pixel sharing unit 24, by employing the pixel sharing structure having four pixels 21 arranged in the vertical direction, thus it is possible to perform an addition of the charges, which is generated in the pixels 21 sensing the same color light, in the FD 33.

Figure 5:
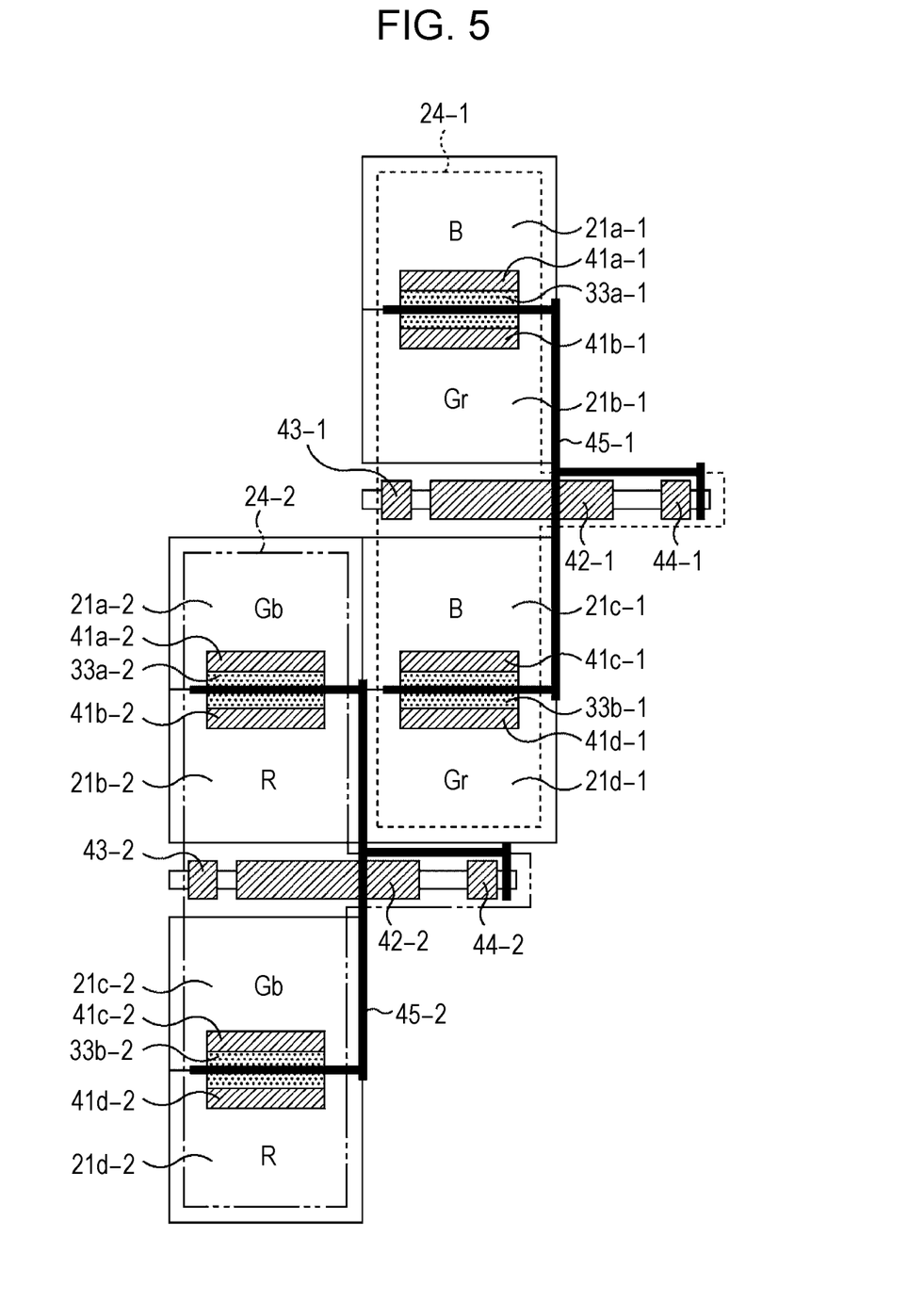
FIG. 5 is a diagram for explaining an addition of charge in an FD.

With reference to FIG. 5, the addition of the charges in the FD 33 will be described.

As illustrated in FIG. 5, in the pixel sharing unit 24-1, the pixel 21a-1 sensing blue light and the pixel 21b-1 sensing green light share an FD 33a-1 and the pixel 21c-1 sensing blue light and the pixel 21d-1 sensing green light share the an FD 33b-1. Furthermore, the FD 33a-1 and the FD 33b-1 are connected to each other by a wire 45-1.

In other words, in the pixel sharing unit 24-1, the FD 33a-1 to which the charge which the pixel 21a-1 generates by sensing blue light is transferred and the FD 33b-1 to which the charge which the pixel 21c-1 generates by sensing blue light is transferred are connected to each other via the wire 45-1. Similarly, in the pixel sharing unit 24-1, the FD 33a-1 to which the charge which the pixel 21b-1 generates by sensing green light is transferred and the FD 33b-1 to which the charge which the pixel 21d-1 generates by sensing blue light is transferred are connected to each other via the wire 45-1.

Accordingly, as a timing when the charge accumulated in the pixel 21a-1 is transferred to the FD 33a-1 and a timing when the charge accumulated in the pixel 21c-1 is transferred to the FD 33b-1 are set to coincide with each other, respective charges are added by the FD 33a-1 and the FD 33b-1 which are connected to each other via the wire 45-1, and applied to a gate electrode 42-1 of an amplifying transistor 34-1. In this way, the amplifying transistor 34-1 outputs the pixel signal corresponding to the level to which the charges generated in the pixel 21*a*-1 and the pixel 21*c*-1 are added (that is, a signal with the blue pixel signal added).

Likewise, a timing when the charge accumulated in the pixel 21*b*-1 is transferred to the FD 33*a*-1 and a timing when the charge accumulated in the pixel 21*d*-1 is transferred to the FD 33*b*-1 are set to coincide with each other. In this way, the amplifying transistor 34-1 outputs the pixel signal corresponding to the level to which the charges generated in the pixel 21*b*-1 and pixel 21*d*-1 are added (that is, a signal with the green pixel signal added).

In addition, in the pixel sharing unit 24-2, similarly to the pixel sharing unit 24-1, as the charges generated by the same color light are added in the FD 33, it is possible to output the pixel signal from the amplifying transistor 34-1.

In the pixel sharing unit 24-2, a timing when the charge accumulated in the pixel 21*a*-2 is transferred to the FD 33*a*-2 and a timing when the charge accumulated in the pixel 21*c*-2 is transferred to an FD 33*b*-2 are set to coincide with each other. In this way, an amplifying transistor 34-2 outputs the pixel signal corresponding to the level to which the charges generated in the pixel 21*a*-2 and pixel 21*c*-2 are added (that is, a signal applied with the green pixel signal added).

Likewise, in the pixel sharing unit 24-2, a timing when the charge accumulated in the pixel 21*b*-2 is transferred to the FD 33*a*-2 and a timing when the charge accumulated in the pixel 21*d*-2 is transferred to the FD 33*b*-2 are set to coincide with each other. In this way, the amplifying transistor 34-2 outputs the pixel signal corresponding to the level to which the charges generated in the pixel 21*b*-2 and pixel 21*d*-2 are added (that is, a signal with the red pixel signal added).

In the pixel sharing unit 24, by sharing the FD 33 in the pixels 21 sensing the same color light, it is possible to add the pixel signal of the same color in the FD 33. In this way, for example, it is possible to improve the sensitivity under the circumference of the low illumination or to improve the sensitivity with the high frame rate.

Here, in the solid-state imaging device 11, it is possible to employ a reverse surface irradiation structure in which input light is input on a reverse surface opposed to a front surface in which the wiring layer is laminated, of the semiconductor substrate in which the PD 31 is formed.

Figure 6:
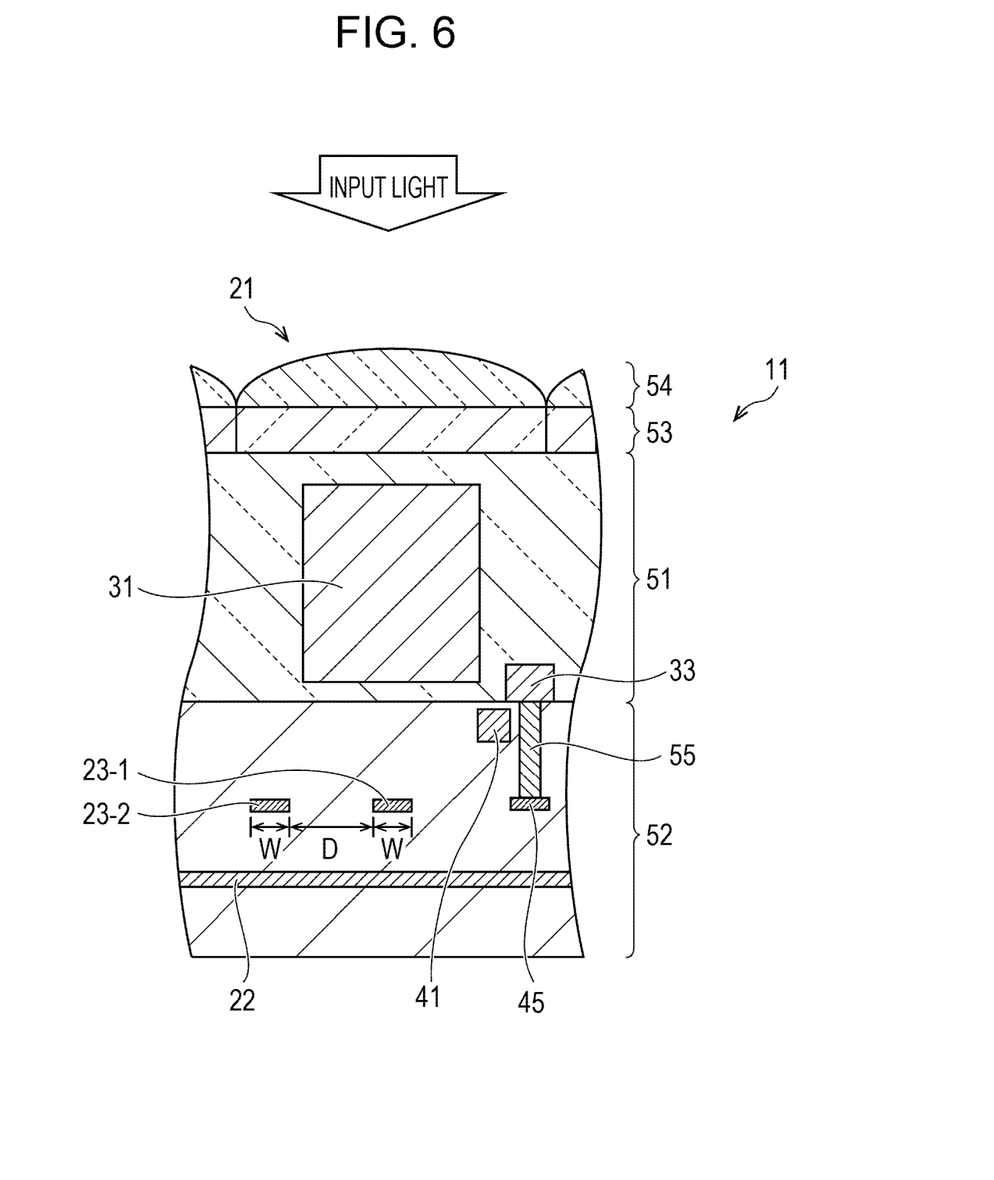
FIG. 6 is a diagram illustrating a configuration example of the cross-sectional structure of the pixel.

In FIG. 6, a configuration example of the cross-sectional structure of the pixel 21 having the solid-state imaging device 11 is illustrated.

As illustrated in FIG. 6, in the solid-state imaging device 11, a wiring layer 52 is laminated on the front surface (a downward surface in FIG. 6) of a semiconductor substrate 51 in which the PD 31 is formed, and a filter 53 and an on-chip lens 54 are laminated on the reverse surface of the semiconductor substrate 51. The input light irradiated from the reverse surface of the solid-state imaging device 11 is concentrated by the on-chip lens 54 in which a small type of lens is arranged in each pixel 21. The predetermined wavelength band of light is transmitted to the filter 53 and input to the PD 31.

In the semiconductor substrate 51, the FD 33 is formed so as to be abutted to the front surface of the semiconductor substrate 51 at a position separated from the PD 31 by the predetermined gap. In addition, on the front surface of the semiconductor substrate 51, the gate electrode 41 in which the transfer transistor 32 is formed at a position between the PD 31 and FD 33 is formed with an insulating film (not shown) therebetween.

As illustrated in FIG. 3, in the wiring layer 52, the wire 45 is formed, which connects the gate electrode 42 in which the amplifying transistor 34 is formed with the FD 33. And the FD 33 and the wire 45 are connected to each other with a penetration electrode 55 interposed therebetween. In addition, in the wiring layer 52, the horizontal signal lines 22 are formed to supply the driving signal to the pixels 21.

Further, in the configuration example of FIG. 6, in the wiring layer 52, two vertical signal lines 23-1 and 23-2 are formed. The vertical signal lines 23-1 and 23-2 are signal lines for outputting the pixel signals from the pixels 21. For example, wiring can be performed such that the vertical signal line 23-1 reads out the pixel signals of the pixel sharing unit 24 arranged in every odd number column, the vertical signal line 23-2 reads out the pixel signals of the pixel sharing unit 24 arranged in every even number column.

In this way, in the solid-state imaging device 11, it is possible to perform reading of the pixel signals in the two of pixel sharing units 24 arranged in the vertical direction in a parallel manner. That is, in the solid-state imaging device 11, by using the two vertical signal lines 23-1 and 23-2, the reading of the pixel signals can be performed at twice the reading speed and the frame rate can be twice as high.

For instance, in the solid-state imaging device which employs a front surface irradiation structure irradiated with the input light from the front surface laminated with the wiring layer 52 on the semiconductor substrate 51, when increasing the number of the vertical signal lines 23, there is a concern that a shading of the input light is generated by the vertical signal lines 23, and sensitivity decreases. In contrast, in the solid-state imaging device 11, it is possible to increase the reading speed without decreasing the sensitivity even when increasing the number of the vertical signal lines 23. And even when increasing the number of the horizontal signal lines 22, it is avoided to affect the sensitivity.

In addition, by increasing the number of the vertical signal lines 23, there is a concern of coupling between the vertical signal lines 23. Accordingly, in the solid-state imaging device 11, as the rear surface irradiation structure is employed, a gap between the vertical signal lines 23 can be largely set, for example, a gap D between the vertical signal lines 23 can be set to be twice the width W of the vertical signal lines 23. Therefore the coupling can be suppressed. In this way, the image quality deterioration such as a vertical stripe can be suppressed. Furthermore, the number of the vertical signal lines 23 may be equal to or more than two, for example, when the number of the vertical signal lines 23 is four, the frame rate can be four times as high.

For example, recently, even though a home camcorder capable of capturing an HD (High Definition) image is realized, hereafter, it is assumed to become the circumference that a high resolution image can be watched at a movie theater, a stadium, home and the like. For instance, in the image having resolution four times as high as that of the HD image, it is necessary to increase the number of pixels in the imaging device four times as many as that of the HD image and to increase the reading speed of the pixel signals four times as high in a state where the frame rate is maintained as that of the HD image. And in a case where a slow motion is often used in sports broadcasting and the like, it is demanded to improve the frame rate further and increase the reading speed of the pixel signal from the imaging device.

Then, as the solid-state imaging device 11, as a high frame rate is realized, it is possible to cope with the requirements as described above.

In addition, in a solid-state imaging device disclosed in Japanese Unexamined Patent Application Publication No. 2009-26984, in order to reduce sensitivity deviation, for example, it is preferable that pixel sharing units be arranged to be shifted by one row in a pixel sharing structure which shares two pixels in a vertical direction, and pixel sharing units be arranged to be shifted by one row or three rows in a pixel sharing structure which shares four pixels in a vertical direction. In contrast, in the solid-state imaging device 11, by employing the reverse surface irradiation structure, the sensitivity deviation can be suppressed. Accordingly, with reference to FIG. 4, it is possible to arrange the pixel sharing unit 24-1 and the pixel sharing unit 24-2 on the pixel-array portion 12 so as to be shifted in the vertical direction by a two-pixel pitch.

Furthermore, the solid-state imaging device 11 as described above, can be applied to various kinds of the electronic apparatus, for example, an imaging system such as a digital still camera and a digital video camera, a mobile phone with an imaging function and other devices with the imaging function.

Figure 7:
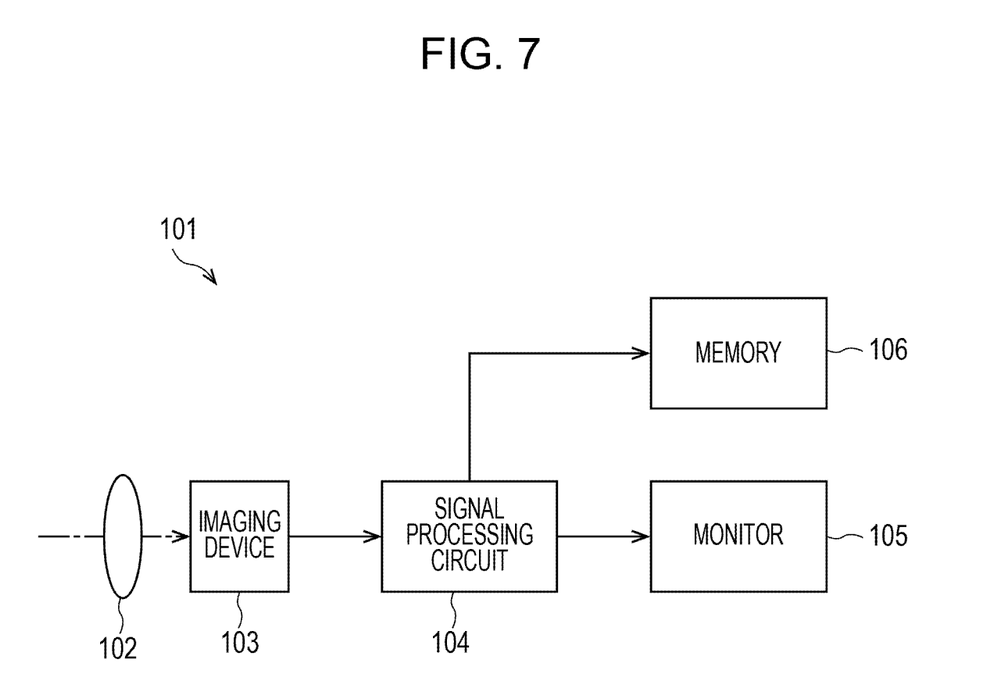
FIG. 7 is a block diagram illustrating a configuration example of the imaging device mounted on an electronic apparatus.

FIG. 7 is a block diagram illustrating a configuration example of the imaging device mounted on n electronic apparatus.

As illustrated in FIG. 7, an imaging device 101 is configured by an optical system 102, an imaging device 103, a signal processing circuit 104, a monitor 105 and a memory 106, and a static image and a video can be captured.

The optical system 102 includes one or more lenses, guides image light (input light) from a subject to the imaging device 103, and forms an image in a sensing surface (sensor portion) of the imaging device 103.

The solid-state imaging device 11 is applied as the imaging device 103. In the imaging device 103, electrons are accumulated for a predetermined period, corresponding to the image formed in the sensing surface with the optical system 102 interposed therebetween. And a signal corresponding to the accumulated electrons in the imaging device 103 is supplied to the signal processing circuit 104.

The signal processing circuit 104 performs various kinds of signal processes with respect to the signal charge output from the imaging device 103. An image (image data) obtained by the signal processing circuit 104 performing the signal processes is supplied and displayed on the monitor 105 or is supplied to and stored (memorized) in the memory 106.

In the imaging device 101 configured as described above, by applying the solid-state imaging device 11 as the imaging device 103, it is possible to obtain a high quality image with the reduced noise, and a video with a high frame rate.

Furthermore, as a configuration of the solid-state imaging device in the present disclosure, a reverse surface irradiation type of CMOS solid-state imaging device, a front surface irradiation type of CMOS solid-state imaging device and a CCD (Charge Coupled Device) solid-state imaging device can be employed.

And then, the present disclosure may also be configured as follows.

(1) A solid-state imaging device including: pixels each of which has a photoelectric conversion portion that senses light and converts the sensed light into a charge; and an amplifying portion which is shared by a predetermined number of the pixels, amplifies the generated charge in the photoelectric conversion portion, and outputs a level of signal corresponding to the charge, wherein the a predetermined number of the pixels which share the amplifying portion are arranged in a first direction extending along a signal line via which the amplifying portion outputs the signal, and wherein a length of an area where the amplifying portion is formed along a second direction substantially intersecting the first direction is set to be equal to or more than a length of one pixel and to be less than a length of two pixels in the second direction.

(2) The solid-state imaging device according to (1), wherein four of the pixels share the amplifying portion, a first pixel and a second pixel are arranged to be adjacent to each other, a third pixel and a fourth pixel are arranged to be adjacent to each other in the first direction, and the amplifying portion is disposed between the second pixel and the third pixel.

(3) The solid-state imaging device according to (1) or (2), wherein a pixel sharing unit which has the four pixels arranged in the first direction and another pixel sharing unit which is disposed to be adjacent to the pixel sharing unit in the first direction are arranged so as to be shifted relative to each other by a two-pixel pitch in the first direction.

(4) The solid-state imaging device according to any one of (1) to (3), further including: a selection portion which connects the amplifying portion and the signal line when selecting a pixel as the pixel outputting the signal; and a reset portion which resets the charge generated in the photoelectric conversion portion, wherein in a range that a length of the area in the second direction in which the amplifying portion, the selection portion and the reset portion are arranged in a line in the second direction is limited to be less than the length of the two pixels in the second direction, a length of the amplifying portion is set to be the maximum.

(5) The solid-state imaging device according to any one of (1) to (4), further including a floating diffusion portion to which the generated charge in the photoelectric conversion portion is transferred, wherein in the pixels which share the amplifying portion, the charges generated in the pixels which sense the same color light are added to the floating diffusion portion.

(6) The solid-state imaging device according to any one of (1) to (5), wherein the signal lines via which the amplifying portion outputs the signal are arranged to be two or more in number.

(7) The solid-state imaging device according to (6), wherein a gap between the signal lines is set to be equal to or more than twice a width of the signal line.

(8) The solid-state imaging device according to any one of (1) to (7), wherein the light to be converted into the charge by the photoelectric conversion portion, is input to a surface opposed to a surface where a wiring layer in which the signal lines are formed is laminated, of a semiconductor substrate in which the photoelectric conversion portion is formed.

The present disclosure contains subject matter related to that disclosed in Japanese Priority Patent Application JP 2011-267505 filed in the Japan Patent Office on Dec. 7, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
  a plurality of pixels, each of the plurality of pixels having a photoelectric conversion portion that is configured to sense light and convert the sensed light into a charge; and
  an amplifying portion which is shared by a predetermined number of pixels of the plurality of pixels, that is configured to amplify the generated charge in the photoelectric conversion portion, and output a level of signal corresponding to the charge,
  wherein the predetermined number of pixels are arranged in a first direction extending along a signal line through which the amplifying portion outputs the signal, and
  wherein a first portion of an amplifying transistor of the amplifying portion is disposed outside a length of a pixel of the predetermined number of pixels and a second portion of the amplifying transistor of the amplifying portion is disposed inside the length of the pixel of the predetermined number of pixels, along a second direction substantially intersecting the first direction.

2. The solid-state imaging device according to claim 1, wherein four of the plurality of pixels share the amplifying portion, a first pixel and a second pixel are arranged to be adjacent to each other, a third pixel and a fourth pixel are arranged to be adjacent to each other in the first direction, and the amplifying portion is disposed between the second pixel and the third pixel.

3. The solid-state imaging device according to claim 2, wherein a pixel sharing unit which has the four pixels arranged in the first direction and another pixel sharing unit which is disposed to be adjacent to the pixel sharing unit in the first direction are arranged so as to be shifted relative to each other by a pitch of two pixels in the first direction.

4. The solid-state imaging device according to claim 1, further comprising:
a selection portion configured to connect the amplifying portion and the signal line when selecting a pixel as the pixel outputting the signal; and
a reset portion configured to reset the charge generated in the photoelectric conversion portion,
wherein in a range that a length of an area in the second direction in which the amplifying portion, the selection portion and the reset portion are arranged in a line in the second direction is limited to be less than a length of two pixels in the second direction, and a length of the amplifying portion is set to be maximum.

5. The solid-state imaging device according to claim 1, wherein signal lines through which the amplifying portion outputs the signal is arranged to be two or more in number.

6. The solid-state imaging device according to claim 5, wherein a gap between the signal lines is set to be equal to or more than twice a width of the signal line.

7. The solid-state imaging device according to claim 1, wherein the light to be converted into the charge by the photoelectric conversion portion, is input to a surface opposed to a surface where a wiring layer in which signal lines are formed is laminated, of a semiconductor substrate in which the photoelectric conversion portion is formed.

8. The solid-state imaging device according to claim 1, further comprising:
a selection portion configured to connect the amplifying portion and the signal line when selecting a pixel as the pixel outputting the signal; and
a reset portion configured to reset the charge generated in the photoelectric conversion portion,
wherein a length of the amplifying portion is set to be greater than a length of the selection portion and a length of the reset portion along the second direction.

9. The solid-state imaging device according to claim 1, wherein a length of the amplifying transistor is set to be equal to the length of the pixel of the predetermined number of pixels along the second direction.

10. A solid-state imaging device comprising:
pixels each of which has a photoelectric conversion portion that senses light and converts the sensed light into a charge;
an amplifying portion which is shared by a predetermined number of the pixels, amplifies the generated charge in the photoelectric conversion portion, and outputs a level of signal corresponding to the charge; and
a floating diffusion portion to which the charge generated in the photoelectric conversion portion is transferred,
wherein the predetermined number of the pixels which share the amplifying portion are arranged in a first direction extending along a signal line via which the amplifying portion outputs the signal,
wherein a length of an area where the amplifying portion is formed along a second direction substantially intersecting the first direction is set to be equal to or more than a length of one pixel and to be less than a length of two pixels in the second direction, and
wherein in the pixels which share the amplifying portion, the charge generated in the pixels which sense the same color light are added to the floating diffusion portion.

11. The solid-state imaging device according to claim 10, wherein in the pixels which share the amplifying portion, a time period at which the pixels sensing the same color light transfer corresponding accumulated charge to a fusion diffusion portion is set to coincide.

12. An electronic apparatus including a solid-state imaging device which comprises:
a plurality of pixels, each of the plurality of pixels having a photoelectric conversion portion that is configured to sense light and convert the sensed light into a charge; and
an amplifying portion which is shared by a predetermined number of pixels of the plurality of pixels, that is configured to amplify the generated charge in the photoelectric conversion portion, and output a level of signal corresponding to the charge,
wherein a predetermined number of pixels are arranged along a first direction extending along a signal line through which the amplifying portion outputs the signal, and
wherein a first portion of an amplifying transistor of the amplifying portion is disposed outside a length of a pixel of the predetermined number of pixels and a second portion of the amplifying transistor of the amplifying portion is disposed inside the length of the pixel of the predetermined number of pixels, along a second direction substantially intersecting the first direction.

* * * * *